United States Patent
Feuilloley

(10) Patent No.: US 7,960,975 B2
(45) Date of Patent: Jun. 14, 2011

(54) METHOD FOR DETECTING THE CONDITION OF A LAMP FOR HEATING BLANK BODIES MADE OF THERMOPLASTIC MATERIAL AND HEATING INSTALLATION ARRANGED FOR USE THEREOF

(75) Inventor: Guy Feuilloley, Octeville-sur-Mer (FR)

(73) Assignee: Sidel Participations, Octeville-sur-Mer (FR)

( * ) Notice: Subject to any disclaimer, the term of this patent is extended or adjusted under 35 U.S.C. 154(b) by 339 days.

(21) Appl. No.: 12/177,489

(22) Filed: Jul. 22, 2008

(65) Prior Publication Data
US 2009/0027870 A1 Jan. 29, 2009

(30) Foreign Application Priority Data
Jul. 25, 2007 (FR) .................................... 07 05422

(51) Int. Cl.
G01R 31/08 (2006.01)
G01R 31/00 (2006.01)
(52) U.S. Cl. ........................ 324/525; 324/414
(58) Field of Classification Search .................. 324/525, 324/512, 500, 555, 414
See application file for complete search history.

(56) References Cited

U.S. PATENT DOCUMENTS

| 4,156,626 | A | 5/1979 | Souder |
| 5,952,832 | A * | 9/1999 | Stevanovic et al. ........... 324/414 |
| 6,556,017 | B1 * | 4/2003 | Pettersson ..................... 324/414 |
| 7,123,031 | B2 * | 10/2006 | Twerdochlib ................. 324/693 |
| 7,141,990 | B2 * | 11/2006 | Bast et al. ..................... 324/708 |
| 7,250,776 | B2 * | 7/2007 | Twerdochlib ................. 324/693 |
| 7,701,231 | B2 * | 4/2010 | Yonushonis et al. .......... 324/718 |
| 2006/0158131 | A1 * | 7/2006 | Mitsuyasu et al. ........ 315/209 R |
| 2010/0033097 | A1 * | 2/2010 | Koh .............................. 315/119 |

* cited by examiner

Primary Examiner — Hoai-An D Nguyen
(74) Attorney, Agent, or Firm — Sughrue Mion, PLLC

(57) ABSTRACT

The condition of a lamp (1) for heating blank bodies made of thermoplastic material, intended for the manufacture of containers by blow moulding or stretch-blow moulding, is detected. The infrared electromagnetic radiation lamp has an envelope (2) made of glass or quartz enclosing a filament (3); the lamp is provided with an electrically conductive element (6) mechanically integral with the envelope; the conductive element is made electrically live and an electrical variable is continuously detected between the terminals of the conductive element when the lamp is in operation; and data representative of the condition of the conductive element, and of the envelope, is supplied.

13 Claims, 3 Drawing Sheets

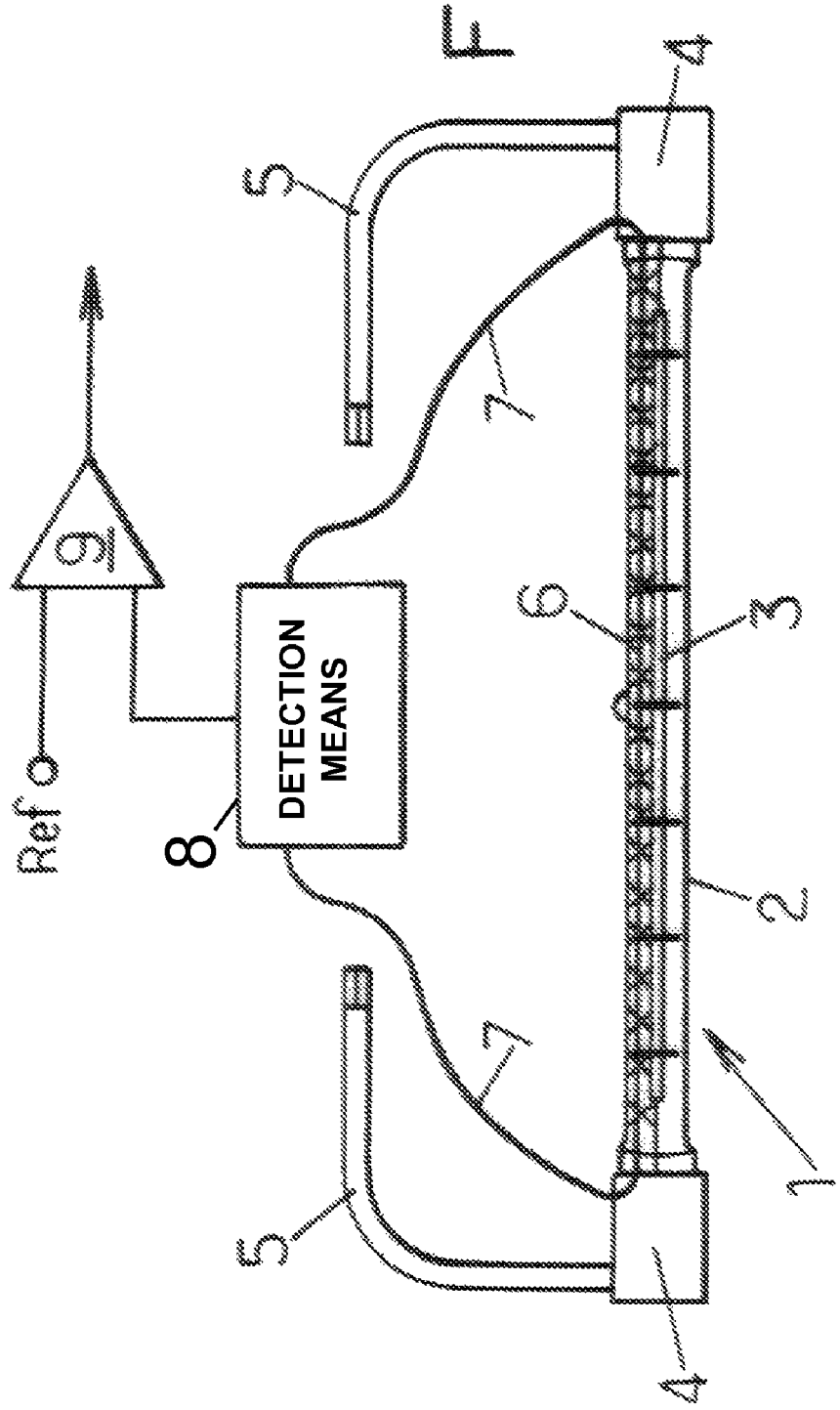

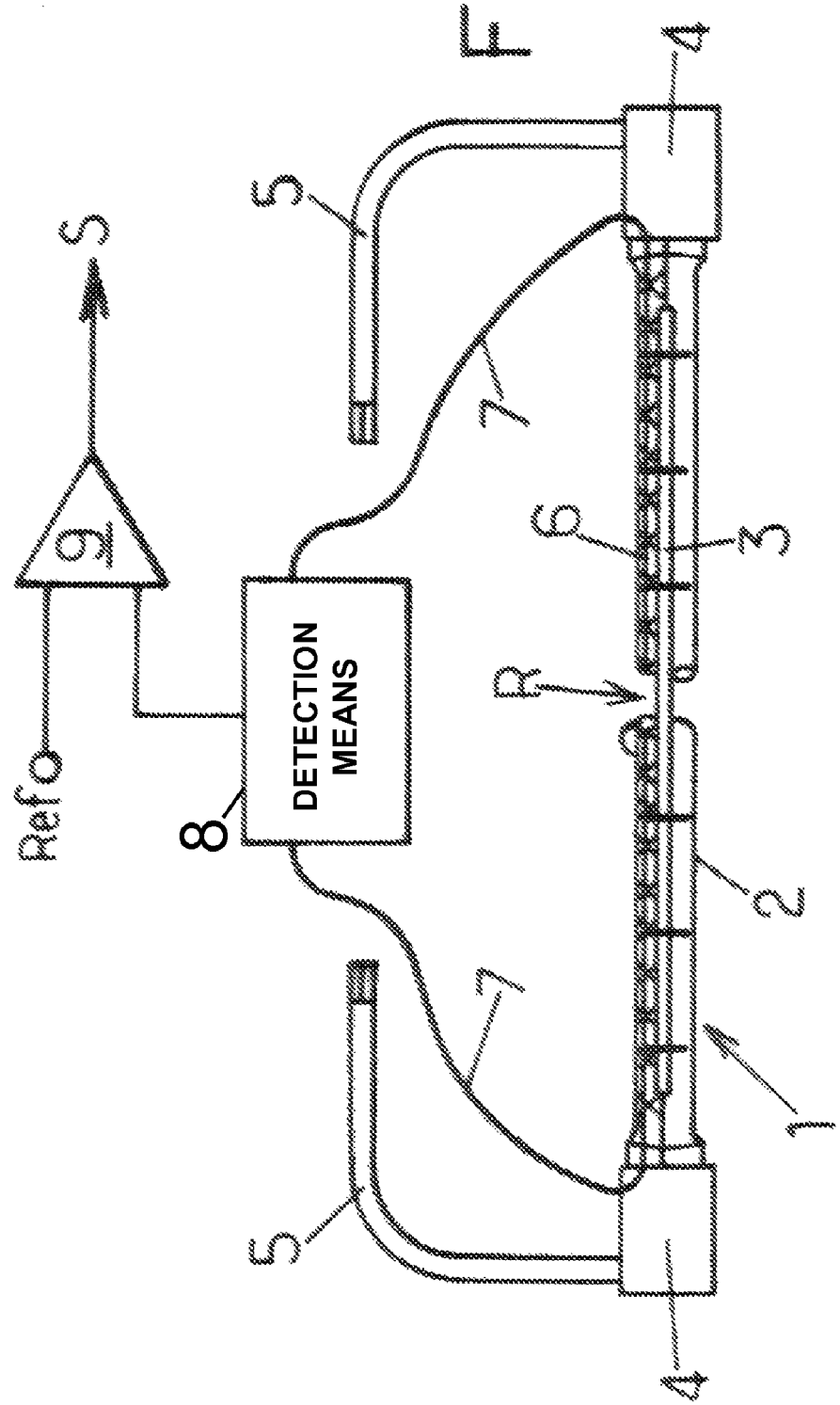

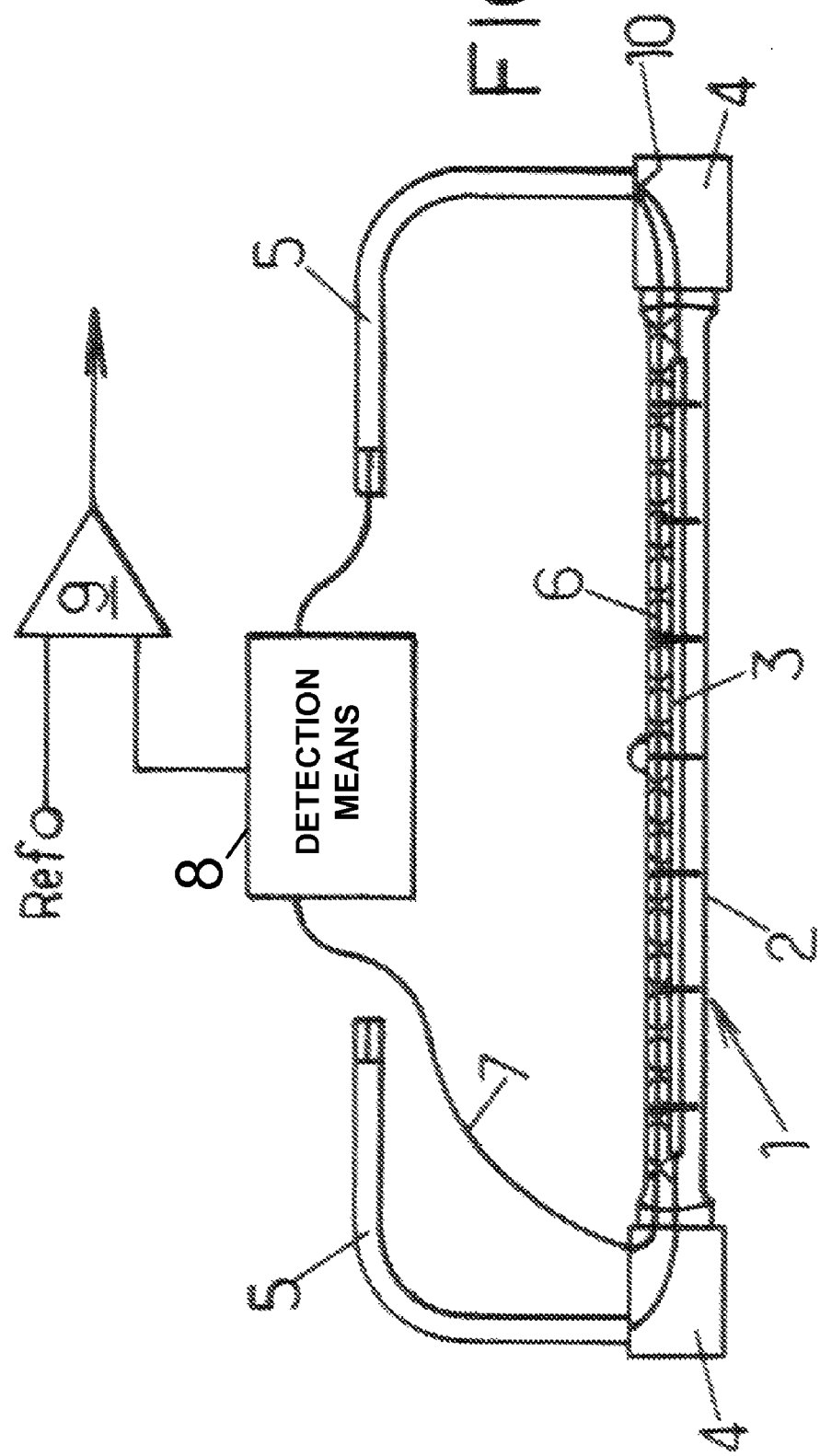

METHOD FOR DETECTING THE CONDITION OF A LAMP FOR HEATING BLANK BODIES MADE OF THERMOPLASTIC MATERIAL AND HEATING INSTALLATION ARRANGED FOR USE THEREOF

FIELD OF THE INVENTION

The present invention relates generally to the field of the manufacture of containers made from thermoplastic material by blow moulding or stretch-blow moulding of hot blanks (preforms or intermediate containers), and it relates more particularly to improvements to the installations for heating the blanks prior to the blow moulding or stretch-blow moulding stage.

BACKGROUND OF THE INVENTION

The blanks are heated by subjecting their bodies to an infrared electromagnetic radiation of appropriate wavelength emitted by infrared incandescent lamps, typically in the general shape of a tube. In practice, the blanks are moved by a conveyor such that their bodies follow a determined path, along which heating lamps are arranged in numbers and positions adapted to the thermal effect to be generated within the thermoplastic material.

It is known to monitor the condition, operational or no operational, of the lamps by using various electrical solutions, the most usual of which consisting of monitoring the intensity of the current supplying them, either individually, or per group. These solutions make it possible to detect when a filament breaks.

However, the lamps used in the installations previously mentioned are halogen atmosphere lamps, which during operation must be kept at a closely defined temperature to ensure that the tungsten particles originating from the filament can be eliminated efficiently by the halogen. If the operating temperature is too high (in the case of insufficient ventilation) or too low (in the case of excessive ventilation), elimination of the tungsten particles by the halogen does not take place, or takes place insufficiently, and tungsten is deposited on the envelope, particularly made of glass or quartz: the envelope then finally disintegrates and breaks.

It has however been noted that breaking of the envelope is not necessarily accompanied by the concomitant breaking of the lamp filament, and there can be a consequent time-lapse (for example several seconds, even several tens of seconds) before the filament breaks (breaking caused by the filament coming into contact with the oxygen in the surrounding air, and its rapid oxidation).

For that reason, the usual means employed to detect breaking of the filament are ineffective for detecting the breaking of the envelope which may precede the breaking of the filament.

Now, breaking the envelope of a lamp is a far from harmless event, and can result in significant damage: the fragments of the envelope, particularly glass or quartz, can destroy adjacent lamps; they can damage the blanks moving past and render them unsuitable for commercial use; they can even lodge in one of these and subsequently remain there, even in the final container; they can damage mechanical parts of the installation and cause jamming in the installation operating at considerable speeds. In all cases, an emergency shutdown of the installation is required, resulting in a loss of production. Finally, the debris of the envelope can cause injury to the staff responsible for repairing the installation.

The current means, the implementation of which is essentially based on the physical condition of the lamp filament, do not make it possible to detect the breaking of the envelope alone, while the filament is still intact.

SUMMARY OF THE INVENTION

The essential purpose of the invention is to provide means (method and installation) which are adapted for detecting the breaking of the envelope as soon as this occurs and while the filament itself can still be intact, so that measures can promptly be taken to avoid serious consequences to the operation of the heating installation and/or injury to the machine-operator and maintenance staff.

To these ends, according to a first aspect thereof, the invention proposes a method for detecting the condition of at least one lamp for heating blank bodies made of thermoplastic material, intended for the manufacture of containers by blow moulding or stretch-blow moulding, this lamp being an incandescent infrared electromagnetic radiation lamp which has an envelope enclosing a filament, this method being characterized according to the invention,
in that said lamp is provided with an electrically conductive element which is mechanically integral with said envelope,
in that said conductive element is made electrically live and an electrical variable is continuously detected between the terminals of said conductive element when the lamp is in operation, and
in that data is generated representative of the condition of the conductive element, and therefore of the envelope.

In theory, any electrical variable (voltage at the terminals, intensity of the current passing through, electrical resistance) can be used to obtain the desired data instantaneously. However, in practical terms the detection of a voltage threshold or an intensity threshold is not simple to carry out under the normal operating conditions of an installation, due to the voltage and/or intensity variations that may occur depending on the mode of operation (at full power or reduced power), according to the number of lamps in operation, the temperature inside the installation, etc. Moreover, it would be necessary to rely on expensive equipment.

As a result, the solution which appears most advantageous and the least limiting structurally and economically consists of continuously detecting the electrical resistance between the terminals of said conductive element when the lamp is in operation, and in that a signal is generated if the measured resistance of said conductive element exceeds a predetermined threshold, in particular becomes substantially infinite. The signal thus generated can then be used in any appropriate manner, for example to trigger the switching off the electricity supply to the lamp and/or an alarm and/or to command stopping the heating, even stopping the installation if convenient.

A simple embodiment of the provisions of the invention can consist in that several heating lamps are provided, each equipped with a conductive element which is mechanically integral with its own envelope, in that all the components are electrically independent of one another, and in that detection of said electrical variable is carried out on each conductive element of each lamp. In other words, in this case each lamp is monitored individually and an alarm can signal precisely the lamp involved, when an incident occurs. Such an embodiment offers the advantage of accuracy and therefore of rapid intervention to replace the defective lamp and return the installation to operation; however it requires a relatively large quantity of equipment which, taken overall, is expensive to purchase, install and maintain.

Therefore, another embodiment can also be provided which is simpler and less expensive, which consists in that several heating lamps are provided, each equipped with a conductive element which is mechanically integral with its own envelope, in that several conductive elements belonging to the respective lamps of a group of lamps are electrically connected in series to each other and in that the detection of said electrical variable is carried out between the terminals of the set of conductive elements in series of said group of lamps. In the event of the envelope of a lamp breaking, the alarm is then given for a group of lamps in which the lamp involved is included, and then the maintenance staff are responsible for determining which lamp of said group must actually be dealt with.

According to a second aspect thereof, the invention provides, to implement the previous method, an installation for heating the blank bodies made of thermoplastic material, intended for manufacturing containers by blow moulding or stretch-blow moulding, this heating installation comprising at least one incandescent lamp using infrared electromagnetic radiation which has an envelope enclosing a filament, said installation, when being arranged according to the invention, being characterized
in that said lamp comprises an electrically conductive element which is mechanically integral with said envelope, and in that the installation comprises
detection means adapted for continuously detecting, while the installation is in operation, an instantaneous electrical variable of said conductive element when electrically live and
indicator means adapted for producing data representative of the condition of the conductive element, and therefore the lamp envelope.

In particular, it can be provided that the indicator means comprise comparator means adapted for comparing the detected value of the electrical variable to a predetermined threshold and for transmitting a signal when said measured electrical variable is situated in a predefined fashion in relation to the predetermined threshold.

Preferably then, the detection means are adapted for continuously detecting the electrical resistance of said conductive element, while the installation is in operation, and the comparator means are adapted for delivering a signal when said detected electrical resistance exceeds a predetermined threshold, in particular becomes substantially infinite, characterizing the breaking of the conductive element and therefore of the envelope.

In practice, the lamp used for the type of heating envisaged is generally tube-shaped; in this case, it is provided that the conductive element extends over the entire length of the envelope.

The arrangement according to the invention can give rise to various practical embodiments: it is possible to provide for the conductive element to be embedded in the wall of the envelope, the conductive element then being possibly a metal wire or strip made; however, in a simple fashion, it may be provided that the conductive element adheres to one face of the envelope, and more particularly to the outside face of the envelope, while being constituted for example as a coating of a metal-type conductive film.

As regards the arrangement of the installation for the use in practice of lamps constituted according to the invention, various solutions can be envisaged here again.

A first solution can consist in that the installation comprises several lamps provided with respective conductive elements and in that individual detection means are operationally associated with said respective conductive elements of the lamps. In other words, the installation is arranged in such a way that each lamp is monitored individually and accurately signalled when breakdown occurs.

However, a more economical solution can consist in that the installation comprises several lamps provided with respective conductive elements, in that several conductive elements belonging to the respective lamps of a group of lamps are electrically connected to each other in series and in that said detection means are connected to the terminals of the conductive elements in series, as a whole, of said group of lamps. Signalling a detected defect is then carried out by a group of lamps and no longer individually per lamp, but the equipment used for this purpose is simpler, and therefore the cost is lower.

BRIEF DESCRIPTION OF DRAWINGS

The invention will be better understood on reading the detailed description which follows of certain embodiments given by way of example only and in no way limitative. In this description, reference will be made to the attached drawing in which:

FIGS. 1A and 1B are very diagrammatic representations of a first embodiment of an arrangement according to the invention of a heating lamp in an installation for heating blanks intended for the manufacture of containers by blow moulding or stretch-blow moulding, this first embodiment being illustrated in two different operational situations respectively, in which the lamp envelope is respectively intact and broken; and FIG. 2 is a very diagrammatic representation of a second embodiment of an arrangement according to the invention which is a variant of the one shown in FIG. 1A.

DETAILED DESCRIPTION OF THE INVENTION

Reference will now be made to FIGS. 1A and 1B, and more particularly firstly to FIG. 1A. The invention is situated in the context of an installation for heating the blank bodies made of thermoplastic material, intended for the manufacture by blow moulding or stretch-blow moulding of containers such as bottles, flasks or others. A heating installation of this type comprises a multiplicity of incandescent heating lamps, in general of the halogen atmosphere type, adapted for emitting an infrared electromagnetic radiation of given temperature and colour. These lamps, generally tube-shaped, are arranged parallel to each other in columns and distributed in several successive columns, for example unilaterally on one side of the path followed by the blank bodies driven by a conveyor.

In FIG. 1A, the part of this heating installation useful in order to assist understanding of the invention is shown in a very diagrammatic representation, namely a lamp 1 (here represented in its standard tubular form) having an envelope 2, which can in particular be made of glass or quartz, enclosing a filament 3; caps 4 at the respective ends hermetically seal the envelope and are connected respectively to the ends of the filament 3; external conductor wires 5 are connected either directly to the respective caps 4 of the lamp 1 as shown in FIG. 1A, or to sockets (not shown) receiving the caps 4 of the lamp.

The lamp 1 comprises an electrically conductive element 6 which is mechanically integral with said envelope 2, such that any violation of the integrity of said envelope 2 surely occurs with a discontinuity in the conductive element 6, in other words breaking the envelope 2 occurs with breaking the conductive element 6. Preferably this conductive element 6 extends over the entire length of the envelope 2, in particular over the entire length of the tubular envelope in the example considered, such that the conductive element 6 can perform its function regardless of the breaking site in the envelope 2.

Various solutions can be envisaged for providing the conductive element 6.

A first solution can consist in that the electrically conductive element is embedded in the wall of the envelope: this solution is certainly effective in respect of the mechanical integrity of the conductive element 6 with the envelope 2, so that it is ensured, by selecting the conductive element 6 to be sufficiently fragile mechanically (for example in the form of a sufficiently thin metal wire or strip), that it will break at the same time as the envelope. However, such an arrangement requires the lamps to be specially manufactured, which necessarily results in lamps which are significantly more expensive than the standard lamps.

Another solution, which at the present time seems preferable, consists in that the conductive element 6 adheres to one face of the envelope 2, particularly to the outside face of the envelope 2; in particular, it is possible to provide producing the conductive element 6 in the form of a spray coating of an electrically conductive film, typically made of metal, on the outside face of the envelope 2. Such a solution has the advantage that in their overall structure the lamps remain standard lamps, and that the conductive element 6 is produced only at a final stage which does not present any particular difficulty (it is known to produce a reflective metallized cover glass on an envelope in this manner): thus, the additional cost of manufacturing such lamps remains modest.

Whichever embodiment is retained, conductive wires 7 are connected to the respective ends of the conductive element 6.

Means of detection 8, connected to said conductive wires 7, are adapted for applying an electrical voltage between the terminals of the conductive element 6 and for continuously detecting, while the installation is in operation, a instantaneous electrical variable (such as the value for the voltage applied to its terminals, intensity of the current passing through, value of its electrical resistance) characteristic of said conductive element 6.

For reasons of reliability and simplicity of use, the most attractive solution consists of using detection means 8 adapted for continuously detecting, while the installation is in operation, the value of the electrical resistance of the conductive element 6, and indicator means adapted for producing data representative of the condition of the conductive element, and therefore of the envelope.

A simple electrical measurement apparatus with a display could surely be sufficient to provide the required data for an operator to be able to take the necessary steps in the case a fault is detected. However, taking account of the large number of lamps present in practice in a heating installation related to by the invention, it is preferable to provide, as shown in FIG. 1A, that indicator means comprise comparator means 9 adapted for comparing the value of the electrical variable detected by the detection means 8 with a predetermined threshold Ref and to generate a signal S when said measured electrical variable is situated in a predefined fashion in relation to said predetermined threshold and becomes representative of the breaking R of the conductive element 6 associated with a breaking of the envelope 2 of the lamp 1 while the filament 3 is still intact, as shown in FIG. 1B: it then becomes possible to use the thus generated signal S for example to cause the automatic switching off of the electrical supply to the affected lamp and/or the triggering of a suitable alarm or indicator system, even bringing the entire installation to a halt.

In a practical example of an embodiment which is simple to implement structurally and operationally, the detection means 8 are adapted for continuously detecting the electrical resistance of said conductive element 6 while the installation is in operation, and the comparator means 9 are adapted for delivering a signal S when said detected electrical resistance exceeds a predetermined threshold, in particular becomes substantially infinite and characterizes a breaking R of the conductive element 6 as shown in FIG. 1B.

The advantage offered by the technical solution proposed by the invention resides in its very high flexibility of implementation, in view of the fact that a heating installation of the type related to by the invention comprises, as stated above, a large number of lamps. As a result, numerous embodiment variants can be found.

In the embodiment shown in FIGS. 1A and 1B, all the lamps of the installation are provided with respective conductive elements 6 and detection means 8 are operationally combined in an individual fashion with said respective conductive elements 6 of the lamps. Thus, the envelopes 2 of the lamps are individually monitored and, if a breakdown occurs, an indicator system identifies which one out of all the lamps is affected.

Nevertheless, a structural simplification and a reduced cost could be obtained, and several solutions can be envisaged to this end.

A first solution can consist of maintaining detection means 8 associated individually with each lamp 1; however, the outputs of all the detection means 8 associated with a defined group of lamps (for example all the lamps of one column) are connected to respective inputs of one single comparator means 9, so that the latter generates a signal S when the envelope 2 of any lamp in the group of lamps is broken.

Another solution, even simpler and even less costly, can consist in that all the conductive elements 6 of the lamps of a defined group of lamps (for example all the lamps of a column, or all the lamps of a heating unit) are electrically connected in series and in that said detection means are connected to the terminals of the set of conductive elements in series of said group of lamps. Once again, an effective indicator system is achieved with very simple means.

Independently of the manner in which the conductive elements of the lamps can be dealt with in the external circuits, it is possible to envisage other methods of mounting the conductive element inside the lamp.

By way of example, in the lamp shown in FIG. 2, one end of the conductive element 6 (right end on the drawing) is connected to the supply wire 10 located on this side. It results in a lamp provided with only three wires, two supply wires and one control wire, which reduces the manufacturing cost of the lamp and simplifies the connection thereof in the installation. The operation remains identical to the one described above.

What is claimed is:

1. A method for detecting a condition of at least one lamp for heating blank bodies made of thermoplastic material, intended for the manufacture of containers by blow moulding or stretch-blow moulding, said method comprising:

providing an incandescent infrared electromagnetic radiation lamp, which has an envelope enclosing a filament, with an electrically conductive element which is mechanically integral with said envelope, said conductive element is made electrically live and comprises terminals;

detecting continuously an electrical resistance between the terminals of said conductive element when the incandescent infrared electromagnetic radiation lamp is in operation; and delivering data which is representative of the condition of the conductive element and of the envelope, said data being a signal which is generated if the detected electrical resistance of said conductive element exceeds a predetermined threshold indicating that the detected electrical resistance is substantially infinite.

2. The method according to claim 1, wherein several heating incandescent infrared electromagnetic radiation lamps are provided, each equipped with a conductive element which is mechanically integral with a corresponding envelope, and the method further comprises:

connecting in series several conductive elements belonging to the respective incandescent infrared electromagnetic radiation lamps of a group of lamps; and detecting said electrical resistance between the terminals of a set of the series connected conductive elements of said group of lamps.

3. The method according to claim 1, further comprising:

based on said signal, performing one of switching off electrical supply to the incandescent infrared electromagnetic radiation lamp, issuing a warning, stopping the heating, stopping an entire installation for heating blank bodies.

4. The method according to claim 1, wherein several incandescent infrared electromagnetic radiation lamps are provided, each equipped with a conductive element which is mechanically integral with a corresponding envelope, wherein all of the conductive elements are electrically independent of each other, and the method further comprises:

detection of detecting said electrical resistance of each conductive element of each incandescent infrared electromagnetic radiation lamp.

5. An apparatus for heating blank bodies made of thermoplastic material, intended for the manufacture of containers by blow moulding or stretch-blow moulding, the apparatus comprising:

at least one incandescent infrared electromagnetic radiation lamp having an envelope enclosing a filament, and an electrically conductive element which is mechanically integral with said envelope;

detection means adapted for continuously detecting, while the apparatus is in operation, an instantaneous value of electrical resistance of said conductive element when electrically live; and indicator means adapted for generating data representative of the condition of the conductive element and of the envelope, said indicator means comprising comparator means adapted for comparing the detected value of the electrical resistance with a predetermined threshold, and generating a signal when said detected value of the electrical resistance exceeds a predetermined threshold indicating that the detected electrical resistance is substantially infinite.

6. The apparatus according to claim 5, comprising several incandescent infrared electromagnetic radiation lamps provided with respective conductive elements, wherein detection means is operationally associated in an individual fashion with each of said respective conductive elements of the incandescent infrared electromagnetic radiation lamps.

7. The apparatus according to claim 5, comprising several incandescent infrared electromagnetic radiation lamps provided with respective conductive elements, wherein several conductive elements belonging to the respective incandescent infrared electromagnetic radiation lamps of a group of lamps are electrically connected in series, and said detection means is connected to terminals of a set of the series connected conductive elements of said group of lamps.

8. The apparatus according to claim 5, wherein said conductive element adheres to one of faces of the envelope.

9. The apparatus according to claim 5, wherein said incandescent infrared electromagnetic radiation lamp is generally tube-shaped, and said conductive element extends over an entire length of the envelope.

10. The apparatus according to claim 5, wherein said conductive element is embedded in a wall of the envelope.

11. The apparatus according to claim 5, wherein said conductive element is a wire or a strip made of metal.

12. The apparatus according to claim 8, wherein said conductive element adheres to an outside face of the envelope.

13. The apparatus according to claim 12, wherein said conductive element is a coating made of an electrically conductive film on the outside face of the envelope.

* * * * *